(12) United States Patent
Frankowsky

(10) Patent No.: US 6,357,027 B1
(45) Date of Patent: Mar. 12, 2002

(54) ON CHIP DATA COMPARATOR WITH VARIABLE DATA AND COMPARE RESULT COMPRESSION

(75) Inventor: Gerd Frankowsky, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/313,016

(22) Filed: May 17, 1999

(51) Int. Cl.⁷ .............................................. G01R 31/28
(52) U.S. Cl. ....................................................... 714/738
(58) Field of Search ................................ 714/711, 718, 714/728, 738; 365/201

(56) References Cited

U.S. PATENT DOCUMENTS 5,553,082 A * 9/1996 Connor et al. ............... 714/736
5,859,804 A * 1/1999 Hedberg et al. ............. 365/201

FOREIGN PATENT DOCUMENTS

DE      42 27 281      10/1994
EP      0 599 524      1/1994

* cited by examiner

*Primary Examiner*—Albert DeCady
*Assistant Examiner*—Shelly A Chase

(57) ABSTRACT

A semiconductor memory chip, in accordance with the present invention, includes a memory array including memory components to be tested. A pattern generator provides reference data to be input to and stored in the memory array. A comparator is formed on the memory chip for comparing the reference data from the pattern generator and the stored data from the memory array. The comparator further includes logic circuitry for comparing the reference data to the stored data from the memory array to provide a compare result having a matched state if the stored data matches the reference data and otherwise an unmatched state. A plurality of latches are included for receiving the compare result from the logic circuitry, the latches having a first state associated with the matched state wherein the first state is altered to a second state if the unmatched state is received from the logic circuitry. A register for storing and outputting the first and second states of the latches to provide a test result is also included.

26 Claims, 3 Drawing Sheets

ON CHIP DATA COMPARATOR WITH VARIABLE DATA AND COMPARE RESULT COMPRESSION

BACKGROUND

1. Technical Field

This disclosure relates to semiconductor memory testing and more particularly, to an apparatus for testing memory devices using an on chip data comparison between input and output data patterns.

2. Description of the Related Art

The rapid growth in circuit complexity has increased the difficulty and cost of testing memories. Development of high density memories introduces a new dimension in testing complexity. For example, higher speed synchronous DRAMs need includes more complex and more time consuming pattern testing. Using test systems for memory testing may require additional equipment to maintain current levels of throughput. It is typically expensive to add additional testers at to maintain the throughput needed for more complex high-speed memory devices.

Another issue concerning the testing of both the current and future generations of high density memories involves chip frequencies relative to the speed and accuracy of the testers. It is becoming more difficult to find high-speed test systems that can keep up with the chips being tested. Typically, device frequency has been growing faster than the accuracy of testers. At the same time, the test equipment is getting more complex. The pin counts are getting higher and therefore the accuracy needs to be managed over more pins. Further, maintaining costs at a reasonable level and performing the tests in a reasonable time frame are also an issue for manufactures and testers.

In semiconductor memory testing, a chip is tested by writing a known data pattern to memory cells in the array by an external testing device. The data pattern is then read back to the device and compared to the known data pattern.

Chip manufacturing processes are not error free. Therefore each memory chip has to be carefully tested, typically using the data patterns described above. Testing costs are presently a major contributor to overall manufacturing costs of memory chips. The test costs may be reduced either by reducing the time required to test a chip and/or to increase the number of chips tested in parallel. The number of chips tested in parallel is usually limited by the number of input/ output (I/O) channels a memory tester can handle. One way to increase the number of chips tested in parallel is to reduce the number of connections between the external tester and the chip under test. Assuming a tester can handle 1024 I/O channels and 130 channels are needed to test one chip, then 7 chips can be tested in parallel.

Referring to FIG. 1, a conventional test setup for testing memory chip is shown. A chip package 10 including a memory chip(s) 14 or a wafer 12 including a plurality of chips 14 may be tested using an external memory tester 16. Depending on the number of I/O channels that tester 16 can handle, and the number of connections needed for a single chip, a certain number of chips may be tested in parallel as described above. To verify the functionality of memory arrays on the chips, tester 16 writes a specific pattern to the memory, reads the data back from the array and compares the original data pattern with the data read from the memory chip. Any discrepancies are reported and used to determine pass/fail criteria for the memory chips (if no module level redundancy is available), and in the case of wafer testing, a bit fail map is generated. In one example, a ×32 memory chip, 32 I/O channels are needed for communication between each memory chip 14 and tester 16.

Therefore, a need exists for an apparatus for testing memory cells to both reduce costs of testing and reduce test time. A further need exists for an apparatus which reduces the number of channels needed to test each chip.

SUMMARY OF THE INVENTION

A semiconductor memory chip, in accordance with the present invention, includes a memory array including memory components to be tested. A pattern generator provides reference data to be input to and stored in the memory array. A comparator is formed on the memory chip for comparing the reference data from the pattern generator and the stored data from the memory array. The comparator further includes logic circuitry for comparing the reference data to the stored data from the memory array to provide a compare result having a matched state if the stored data matches the reference data and otherwise an unmatched state. A plurality of latches are included for receiving the compare result from the logic circuitry, the latches having a first state associated with the matched state wherein the first state is altered to a second state if the unmatched state is received from the logic circuitry. A register for storing and outputting the first and second states of the latches to provide a test result is also included.

Another semiconductor memory chip includes a memory array including memory components to be tested and redundancies for replacement of defective memory components, the redundancies each including a set of components. A pattern generator is included for providing reference data to be input to and stored in the memory array, and a comparator is formed on the memory chip for comparing the reference data from the pattern generator and the stored data from the memory array. The comparator further includes logic circuitry for comparing the reference data set to the stored data from the memory array to provide compare results having a matched state if the stored data matches the reference data and otherwise an unmatched state. A multiplexer stage is included for receiving the compare results and compressing the compare results to provide redundancy compatible data compression such that any unmatched state associated with any components of a set of components permits replacement with a redundancy of the same size as the set of components. A plurality of latches receives the compare results from the multiplexer stage, the latches having a first state associated with the matched state wherein the first state is altered to a second state if the unmatched state is received from the logic circuitry. A register is also include for storing and outputting the first and second states of the latches to provide a test result.

A DRAM memory chip in accordance with the present invention includes a memory array including memory components to be tested and redundancies for replacement of defective memory components, the redundancies each including a set of components. A pattern generator is included on the memory chip for providing reference data to be input to and stored in the memory array, and a comparator is formed on the memory chip for comparing the reference data set from the pattern generator and the stored data from the memory array, the comparator being coupled to read/write data lines of the memory array for retrieving the stored data from the memory array. The comparator further includes logic circuitry for comparing the reference data set to the stored data from the memory array to provide compare results having a matched state if the stored data matches the reference data and otherwise an unmatched state. A synchronization stage is included for synchronizing compare results output from the logic circuitry. A multiplexer stage receives the compare results associated with each memory component and compresses the compare results for each memory component to provide redundancy compatible data compression such that any unmatched state associated with any components of a set of components permits replacement with a redundancy of the same size as the set of components. A plurality of latches is included for receiving the compare results from the multiplexer stage. The latches have a first state associated with the matched state wherein the first state is altered to a second state if the unmatched state is received from the logic circuitry. A shift register is included for storing and outputting the first and second states of the latches to provide a test result.

In alternate embodiments of the present invention, the logic circuitry preferably includes one of an exclusive or gate and an exclusive nor gate, the gates including inputs for reference data and store data from the memory array. The semiconductor memory chip may further include a synchronization stage for synchronizing compare results output from the logic circuitry. The semiconductor memory chip may further included a multiplexer for receiving compare results from the logic circuitry and compressing the compare results to provide redundancy compatible data compression. The redundancy compatible data compression may be employed for testing one of wordlines, column select lines and memory banks. The semiconductor memory chip may include an on chip logic circuit for resetting the latches to the first state before compare cycles or an off chip external control device for resetting the latches to the first state before compare cycles. The register preferably includes a shift register and the test result may be compressed to a single bit, or the test result may be serially transmitted. The comparator is preferably coupled to read/write data lines to obtain the stored data from the memory array. The logic circuitry preferably includes one of an exclusive or gate and an exclusive nor gate, the gates including inputs for reference data and store data from the memory array.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor memory testing and more particularly, to an apparatus for testing memory devices using an on chip data pattern comparator. The comparator is preferably designed and built as part of the memory chip. The comparator provides variable data compression for data read from a memory array of a memory chip being tested. The comparator also provides compression of test results. The comparator in accordance with the present invention advantageously reduces the number of I/O channels for communication with an external tester to two channels.

Figure 2:
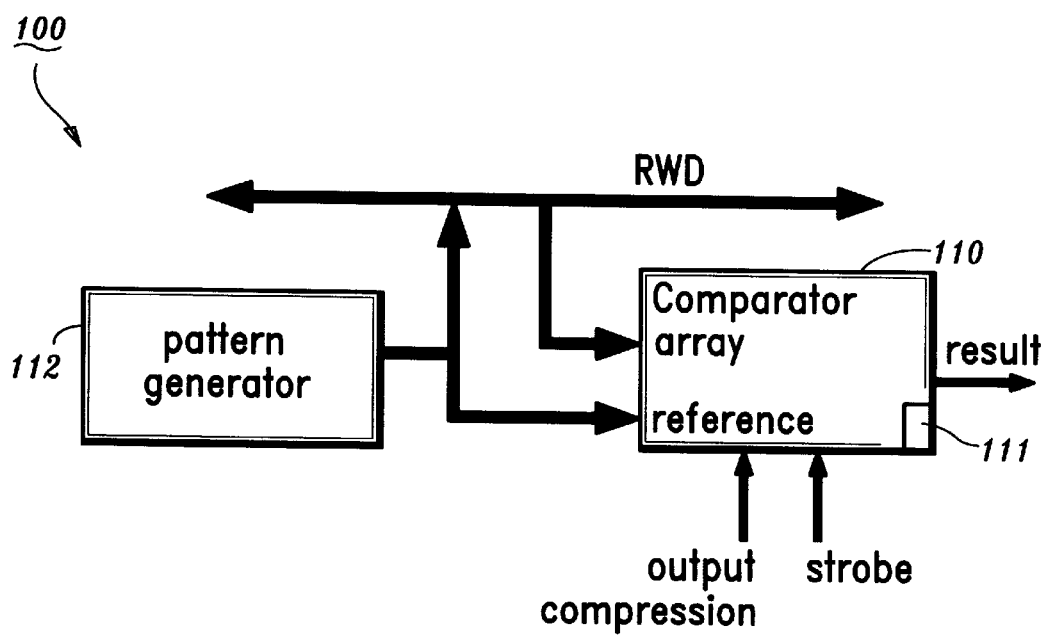
FIG. 2 is a block diagram of a memory device having a comparator formed thereon in accordance with the present invention.

The following disclosure will illustratively describe the present invention in terms of a dynamic random access memory (DRAM) and its components. The present invention's description hereinafter is non-limiting and may apply to other semiconductor devices as well. Referring now in specific detail to the drawings in which like reference numerals identify similar or identical elements throughout the several views, and initially to FIG. 2, a semiconductor memory device/chip 100 is shown. Semiconductor memory device 100 includes a memory array including memory cells (not shown). Data is sent to and from memory cells on Read/Write Datalines (RWDs). Semiconductor memory device 100 includes an on chip data comparator 110 thereon in accordance with the present invention. Comparator 110 is coupled directly to a data path of memory chip 100 by, for example, connecting comparator 110 to Read/Write Datalines (RWDs) of memory chip 100. For memory testing, a pattern generator 112 provides pattern data bits (reference pattern) to both the memory array via RWD and to comparator 110. The reference pattern may be stored inside a memory 111 of comparator 110 from a previous write operation or generated by an on-chip pattern generator. Reference pattern data as well as array data are input to comparator 110 for comparison. An output compression input sets a compression mode for data results to be transmitted from comparator 110. The output compression input may be set by selecting a test mode for the operation of the test of memory chip 100. In this ways no I/O pin is needed to set the compression mode. A strobe input is also provided for comparator 110. Strobe provides synchronization between array and reference data for the comparison performed by comparator 110. An interface, such as a serial interface, between an external tester and the chip(s) to be tested, reduces the number of communication channels needed to test each memory chip 100 to 2, i.e., strobe and result. The result output may include a single bit representing a pass/fail criteria or additional information depending on the mode selected.

Figure 3:
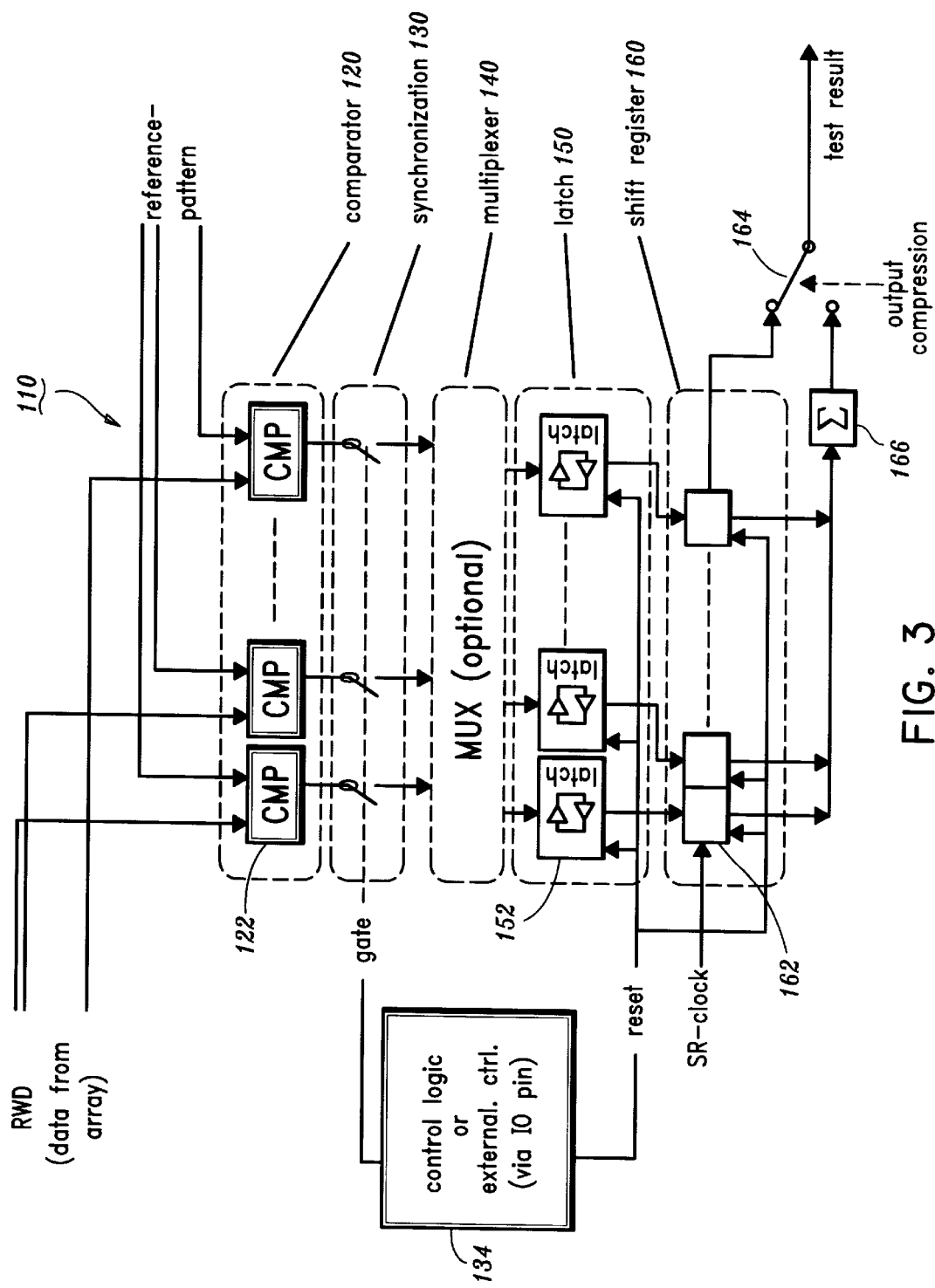
FIG. 3 is a schematic diagram of the comparator of FIG. 2 showing greater details of the comparator in accordance with the present invention.

Referring to FIG. 3, comparator 110 is shown in greater detail in accordance with the present invention. A comparator stage 120 includes a plurality of logic comparators 122. Each comparator 122 may include a exclusive or (XOR) or an exclusive nor (XNOR) gates. Each comparator 122 receives input from the reference data path (pattern generator, preferably an on chip pattern generator) and from the array data path (from RWDs for example). The inputs are compared in comparator stage 120.

A synchronization stage 130 synchronizes data from the array with the reference data (from pattern generator). Synchronization stage 130 is optional since array data and reference data may already be synchronized. Synchronization stage may include a plurality of switches 132 which preferably include transistor enabled by a gate signal. Gate signal is provided by an on chip control logic circuit 134 or by an external tester via an I/O pin.

A multiplexer stage 140 may also be included. Multiplexer stage 140 is preferably employed to permit a redundancy compatible data compression scheme. This will be explained in greater detail below.

Output of comparators 122 includes a compare result. The compare result defines a state for latches 152 included in latch stage 150. Latches 152 are reset or initialized before each compare cycle starts. A compare cycle may include a single test or a set of tests for testing (comparing) one or more memory cells on each chip or all the cells on each chip to the data pattern. Single memory cells or groups of memory cells can be tested, and the results of the test are compressed according to a selected compression ratio such that bits are output to latches 152 representing a single memory cell, a group of memory cells or all memory cells on a chip, as determined based on the compression ratio. This provides the compare result. Latches are preferably reset using a reset signal which is provided by on chip control logic circuit 134 or by the external tester via an I/O pin prior to the compare cycle. As long as the comparison between reference data and the array data is "good", i.e., the data matches, latches 152 remain in the same initialized state. If the comparison between reference data and the array data is "bad", i.e., the data does not match, latches 152 change states to a non-initialize state. Each latch 152 functions individually and changes state independently based on comparison results from comparators 122. Only a "bad" result changes the state of each latch 152. This feature of the present invention permits flexibility for data compression as will be described below in greater detail.

A register stage 160 preferably includes a shift register 162. All latches 152 are connected to shift register 162. Shift register 162 performs parallel to serial conversions of the compare result provided by comparators 122. In one embodiment, the compare result is compressed to a single bit when only a pass/fail result is needed for the memory array being tested. A switch 164 is included to provide a way of selecting the output or data compression type used as the test result. In a first type of data compression, the data in shift register 162 is summed by a summer 166 and output as a single bit, for example a 0 or a 1. Shift register 162 is synchronized by an SR-clock signal input thereto. In one embodiment, a zero sum is a pass test result while a non-zero sum is a fail test result. In a second type of data compression, the values in shift register 162 are output directly providing more detailed test information. Switch 164 is activated by a user selected mode which provides an output compression signal in accordance therewith.

Figure 4:
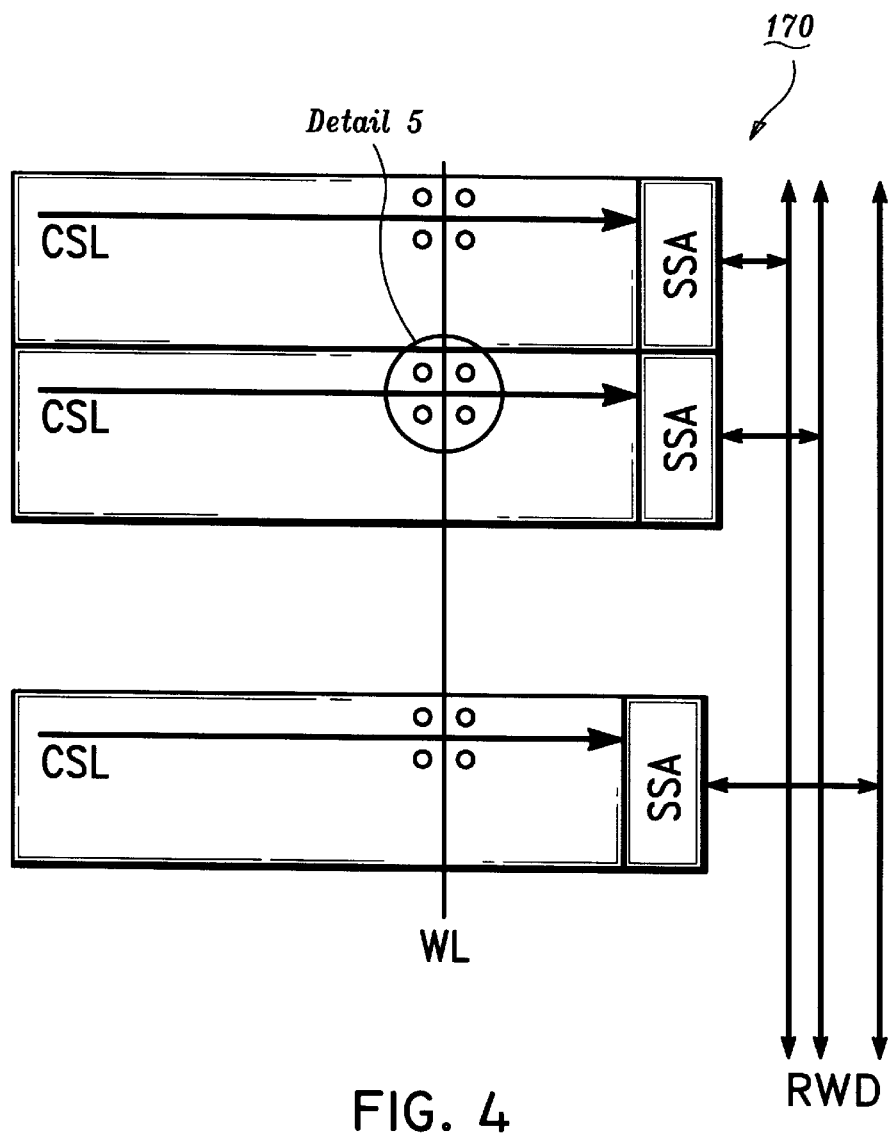
FIG. 4 is a schematic diagram of a memory array showing components to be used to implement the comparator for redundancy compatible data compression in accordance with the present invention.
Figure 5:
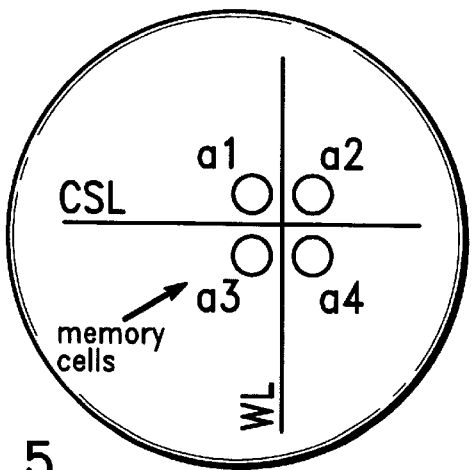
FIG. 5 is an exploded view of detail 5 of FIG. 4.

Referring to FIGS. 4 and 5, a simplified memory array 170 is schematically shown. Memory array 170 includes secondary sense amplifiers SSA which drive the RWDs. On chip data comparator 110 (FIG. 3) advantageously permits extremely flexible data compression based on addressing schemes. For memory array operation, for example reading and writing data, a wordline WL and a column select line CSL are activated. The activation of a CSL and a WL results in accessing 4 memory cells a1–a4, i.e., a set. The memory cells are therefore not independent of each other. Whenever one of cells a1–a4 is addressed, all four cells are accessed. This is also true for redundant memory array elements. Redundant elements such as wordlines, and column select lines also access four memory cells in the redundant memory array (not shown). Regardless of which cell (a1–a4) shows a defect, all four cells are replaced if a redundant element is needed. Compressing compare results of the cells a1–a4 is a redundancy compatible data compression.

The data compression is controlled by latches 152. All compare results are accumulated in latches 152, until a reset signal from an external memory tester or from an on chip logic circuit reinitializes the latches as described above. The present invention advantageously utilizes the latch states to identify defects in any elements of the memory array. For example, addressing methods and data patterns may be implemented to provide defect checks on complete wordlines, of column select lines, of memory banks or other arbitrary portions of the array. For redundancy compatible data compression, a set of memory components are tested using comparators 122. The set of memory components, which are compatible to the replacement size of redundancies which would be used to replace the set of components, have their compare results multiplexed by multiplexer 140 to compress the bits to a single compare result. In other words, if one of the set fails the entire set is considered to fail thereby significantly compressing the data output for test results.

Figure 1:
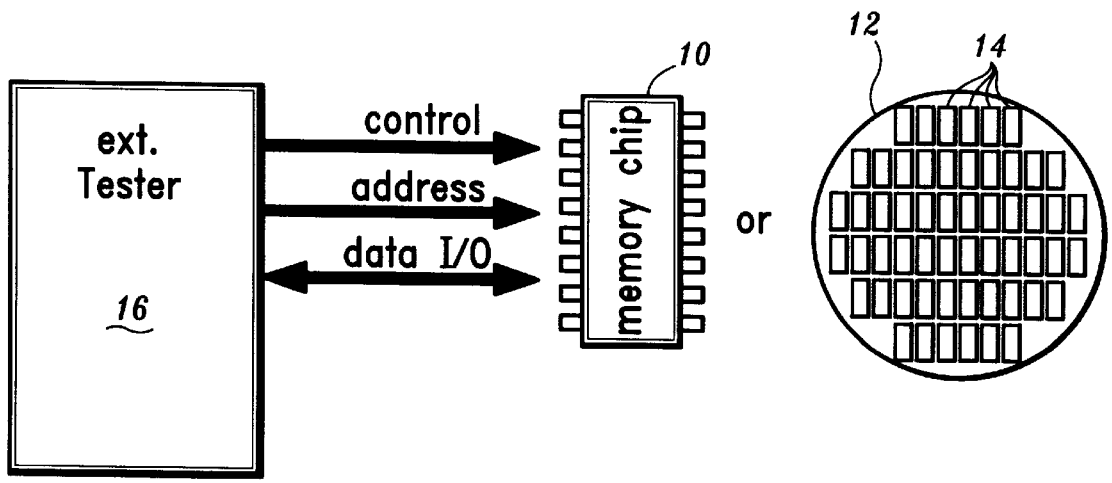
FIGS. 1 is a diagram showing a memory chip test set up in accordance with the prior art.

Further, by incorporating an on chip comparator in accordance with the present invention, channels normally used for comparing array data to reference data become available. For example, about 31 channels are available per chip in a typically setup (See FIG. 1). This means the tester may now test significantly more than 7 chips in parallel thereby increasing throughput for acceptance testing of memory chips. Even further improvements may be realized if an on chip pattern generator is employed.

Having described preferred embodiments for on chip data comparator with variable data and compare result compression (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor memory chip comprising:
   a memory array including memory components to be tested;
   a pattern generator for providing reference data to be input to and stored in the memory array; and
   a comparator formed on the memory chip for comparing the reference data from the pattern generator and the stored data from the memory array, the comparator further comprising:
   logic circuitry for comparing the reference data to the stored data from the memory array to provide compare results having a matched state if the stored data matches the reference data and otherwise an unmatched state;
   a plurality of latches for receiving the compare results from the logic circuitry, the latches having a first state associated with the matched state wherein the first state is altered to a second state if the unmatched state is received from the logic circuitry;
   a register for storing and outputting the first and second states of the latches to provide a test result; and
   an output compression input which selects an output compression mode using an on chip generated signal.

2. The semiconductor memory chip as recited in claim 1, wherein the logic circuitry includes one of an exclusive or gate and an exclusive nor gate, the gates including inputs for reference data and store data from the memory array.

3. The semiconductor memory chip as recited in claim 1, further comprising a synchronization stage for synchronizing the compare results output from the logic circuitry.

4. The semiconductor memory chip as recited in claim 1, further comprising a multiplexer for receiving the compare results from the logic circuitry and compressing the compare results to provide redundancy compatible data compression.

5. The semiconductor memory chip as recited in claim 4, wherein the redundancy compatible data compression is employed for testing one of wordlines, column select lines and memory banks.

6. The semiconductor memory chip as recited in claim 1, further comprising an on chip logic circuit for resetting the latches to the first state before compare cycles.

7. The semiconductor memory chip as recited in claim 1, further comprising an off chip external control device for resetting the latches to the first state before compare cycles.

8. The semiconductor memory chip as recited in claim 1, wherein the register includes a shift register and the test result is compressed to a single bit.

9. The semiconductor memory chip as recited in claim 1, wherein the register includes a shift register and the test result is serially transmitted.

10. The semiconductor memory chip as recited in claim 1, wherein the comparator is coupled to read/write data lines to obtain the stored data from the memory array.

11. A semiconductor memory chip comprising:
    a memory array including memory components to be tested and redundancies for replacement of defective memory components, the redundancies each including a set of components;
    a pattern generator for providing reference data to be input to and stored in the memory array; and
    a comparator formed on the memory chip for comparing the reference data from the pattern generator and the stored data from the memory array, the comparator further comprising:
    logic circuitry for comparing the reference data to the stored data from the memory array to provide compare results having a matched state if the stored data matches the reference data and otherwise an unmatched state;
    a multiplexer stage for receiving the compare results and compressing the compare results to provide redundancy compatible data compression such that any unmatched state associated with any components of a set of components permits replacement with a redundancy of the same size as the set of components;
    a plurality of latches for receiving the compare results from the multiplexer stage, the latches having a first state associated with the matched state wherein the first state is altered to a second state if the unmatched state is received from the logic circuitry;
    a register for storing and outputting the first and second states of the latches to provide a test result; and
    an output compression input, which selects an output compression mode using an on chip generated signal.

12. The semiconductor memory chip as recited in claim 11, wherein the logic circuitry includes one of an exclusive or gate and an exclusive nor gate, the gates including inputs for reference data and store data from the memory array.

13. The semiconductor memory chip as recited in claim 11, further comprising a synchronization stage for synchronizing compare results output from the logic circuitry.

14. The semiconductor memory chip as recited in claim 11, wherein the redundancy compatible data compression is employed for testing one of wordlines, column select lines and memory banks.

15. The semiconductor memory chip as recited in claim 11, further comprising an on chip logic circuit for resetting the latches to the first state before compare cycles.

16. The semiconductor memory chip as recited in claim 11, further comprising an off chip external control device for resetting the latches to the first state before compare cycles.

17. The semiconductor memory chip as recited in claim 11, wherein the register includes a shift register and the test result is compressed to a single bit.

18. The semiconductor memory chip as recited in claim 11, wherein the register includes a shift register and the test result is serially transmitted.

19. The semiconductor memory chip as recited in claim 11, wherein the comparator is coupled to read/write data lines to obtain the stored data from the memory array.

20. A DRAM memory chip comprising:
    a memory array including memory components to be tested and redundancies for replacement of defective memory components, the redundancies each including a set of components;
    a pattern generator included on the memory chip for providing a reference data to be input to and stored in the memory array; and a comparator formed on the memory chip for comparing the reference data set from the pattern generator and the stored data from the memory array, the comparator being coupled to read/write data lines of the memory array for retrieving the stored data from the memory array, the comparator further comprising:

logic circuitry for comparing the reference data to the stored data from the memory array to provide compare results having a matched state if the stored data matches the reference data and otherwise an unmatched state;

a synchronization stage for synchronizing the compare results output from the logic circuitry, a multiplexer stage for receiving the compare results associated with each memory component and compressing the compare results for each memory component to provide redundancy compatible data compression such that any unmatched state associated with any components of a set of components permits replacement with a redundancy of the same size as the set of components;

a plurality of latches for receiving the compare result from the multiplexer stage, the latches having a first state associated with the matched state wherein the first state is altered to a second state if the unmatched state is received from the logic circuitry; and a shift register for storing and outputting the first and second states of the latches to provide a test result.

21. The DRAM memory chip as recited in claim 20, wherein the logic circuitry includes one of an exclusive or gate and an exclusive nor gate, the gates including inputs for reference data and store data from the memory array.

22. The DRAM memory chip as recited in claim 20, wherein the redundancy compatible data compression is employed for testing one of wordlines, column select lines and memory banks.

23. The DRAM memory chip as recited in claim 20, further comprising an on chip logic circuit for resetting the latches to the first state before compare cycles.

24. The DRAM memory chip as recited in claim 20, further comprising an off chip external control device for resetting the latches to the first state before compare cycles.

25. The DRAM memory chip as recited in claim 20, wherein the test result is compressed to a single bit.

26. The DRAM memory chip as recited in claim 20, wherein the test result is serially transmitted.

* * * * *